United States Patent [19]

Traupe et al.

[11] Patent Number: 4,775,894
[45] Date of Patent: Oct. 4, 1988

[54] MODULAR SENSOR LINE

[75] Inventors: Ulrich Traupe, Wiesbaden; Manfred Dennhoven, Osterspai, both of Fed. Rep. of Germany

[73] Assignee: Heimann Wiesbaden, Fed. Rep. of Germany

[21] Appl. No.: 924,977

[22] Filed: Oct. 30, 1986

[30] Foreign Application Priority Data

Dec. 13, 1985 [DE] Fed. Rep. of Germany ....... 3544121

[51] Int. Cl.$^4$ .......................................... H04N 1/024
[52] U.S. Cl. .................................. 358/294; 358/285; 358/213.15; 358/293
[58] Field of Search .................. 358/293, 294, 213.11, 358/285, 213.14, 213.15

[56] References Cited

U.S. PATENT DOCUMENTS 4,471,375 9/1984 Oritsuki et al. ..................... 358/294
4,644,411 2/1987 Sato et al. ......................... 358/294

Primary Examiner—Edward L. Coles, Sr.
Attorney, Agent, or Firm—Hill, Van Santen, Steadman & Simpson

[57] ABSTRACT

An image sensor line for reading optical information is constructed of a number of identical modules disposed side-by-side. Each module includes a row of sensors, such as optoelectrical transducers, and a signal processing circuit. The sensors and signal processing circuit in combination form an integrated circuit module. Sensor lines of arbitrary length can be constructed from such modules.

3 Claims, 3 Drawing Sheets

MODULAR SENSOR LINE

BACKGROUND OF THE INVENTION

Field of the Invention

The present invention relates to an image sensor line for reading optical information in the form of a row of optoelectrical transducers, and a processing circuit allocated to each transducer.

RELATED APPLICATION

This application is related to an application filed simultaneously herewith (Traupe, Dennhoven and Heimann), U.S. Ser. No. 924,973.

DESCRIPTION OF THE PRIOR ART

Image sensor lines are known for reading optical information in the form of text or graphics, and converting the optical information into an analog electrical signal. The analog electrical signal is then converted into digital information for sorting and storing purposes. The digitally ordered and stored information can be made usable in a known manner for all types of image processing and image reproduction, for example, telecopying or video reproduction.

Heretofore, such imaging and conversion was achieved by line sensors having a feed perpendicular to the access of the line and constructed according to one of the following structures.

A first known structure uses demagnification optics for projecting an image of an original onto CCD lines having a length of, for example, 22.5 mm. A disadvantage of this method is the low depth of field of the imaging beam path and the extreme demands of precision adjustment which are required as a result. Moreover, the beam path occupies an undesirably large space.

Another known construction uses gradient index fiber optics for projecting a 1:1 image of an original onto an arrangement of CCD lines, each having a length of about 6 cm. This method has the disadvantages that the CCDs must be manufactured with a greatest possible length, and thus a greatest surface, in order to exploit the advantages of the CCD principle. As a consequence, however, high charge losses occur due to shifting the electrical charges in the CCDs over distances of 6 cm. Moreover, CCD chips having such a large area (for example, $65 \times 5$ mm$^2$=325 mm$^2$ cannot be currently manufactured with an adequately high yield at justifiable prices, particularly because the possibility of improving the yield by introducing redundancies does not exist.

A third known sensor structure also makes use of gradient index fiber optics for projecting a 1:1 image of the original onto sensor lines, however, these sensor lines consist of photoconductive material such as a-Si:H. Sensor lines employed in known embodiments of this structure consist of a linear arrangement of aSi:H photoconductor cells having eight, twelve or sixteen picture points/mm, each cell being provided with read-out and signal processing elements. The read-out and signal processing elements are manufactured using monocrystalline technique. Connections between the sensors and the read-out and signal processing elements are made by wires and conductor runs.

Two known principals are generally employed for driving the individual sensors and for signal processing. For read-out of the sensors, the so-called Vidicon principal is used, as explained in FIG. 1. A second principal measures the voltage at the light-sensitive cell, as described in connection with FIG. 2. In both principals, a plurality of individual sensors, such as sensors 2, 3 and 4, are individually serially driven by a shift register 1. Each sensor is schematically represented as a current source with a parallel capacitance.

In the read-out arrangement based on the Vidicon principal shown in FIG. 1, one electrode E is shared by all of the light-sensitive sensors 2, 3 and 4. Closure of respective switches 5, 6 and 7 after an integration time causes the corresponding sensor to be reset to its initial condition. The current which flows in the common electrode E is a measure of the amount of light absorbed by the corresponding sensor. By opening the respective switches 5, 6 and 7 by operation of the shift register 1, the integration phase for the respective sensor begins. As a result of the parallel connection of all sensors 2, 3 and 4 by the common electrode E, a large capacitance 8, 9 and 10 is present in parallel with the respective sensors 2, 3 and 4. A capacitive signal division thus occurs, which requires very high post-amplification. A poor signal-to-noise ratio is thus achieved.

Conditions are more favorable using the principal of measuring the voltage at the individual light-sensitive sensors 2, 3 and 4 (analog signal editing). As shown in FIG. 2, the shift register 1 operates to forward the discharge state of a sensor 2, 3 and 4 to the common signal output of respective amplifiers 11, 12 and 13 after the integration time, one amplifier being provided for each sensor. As soon as the amplifier for the next light sensitive sensor is connected to the output, the preceeding sensor is reset to its initial condition and a new integration phase for that sensor begins. During this time, the sensor voltage U(t) changes as follows:

$$U(t) = U_o - (i \cdot t)/c$$

wherein t is the integration time, i is the current in the sensor (proportional to the illumination intensity), C is the capacitance of the sensor plus the other components, such as connecting lines and the input capacitance of the amplifier (represented in bulk by capacitances 8, 9 and 10), and $U_o$ is the initial (start) voltage.

In addition to dependancy upon the illumination intensity and on the integration time, the size of the signal output is greatly dependent on the capacitance C. As can be seen from the above equation, the signal output becomes greater with lower capacitance, if the other values are otherwise unaltered. A goal in the design of a sensor line must therefore be minimization of the additional capacitances which are in parallel with the individual sensors. Such capacitances can be caused by conductor runs, contact surfaces, input capacitances, and the like.

SUMMARY OF THE INVENTION

It is an object of the present invention to provide a sensor line wherein such additional capacitances are minimized.

The above object is achieved in accordance with the principals of the present invention in a sensor line constructed of a plurality of modules disposed in series, each module including a module sensor line consisting of a plurality of sensors and respective amplifiers and other processing elements constructed as an integrated circuit module. Each sensor module may, for example, contain 128 linearly arranged picture elements. The undesirable added capacitances are thereby reduced to a minimum.

DESCRIPTION OF THE PREFERRED EMBODIMENTS

Figure 1:
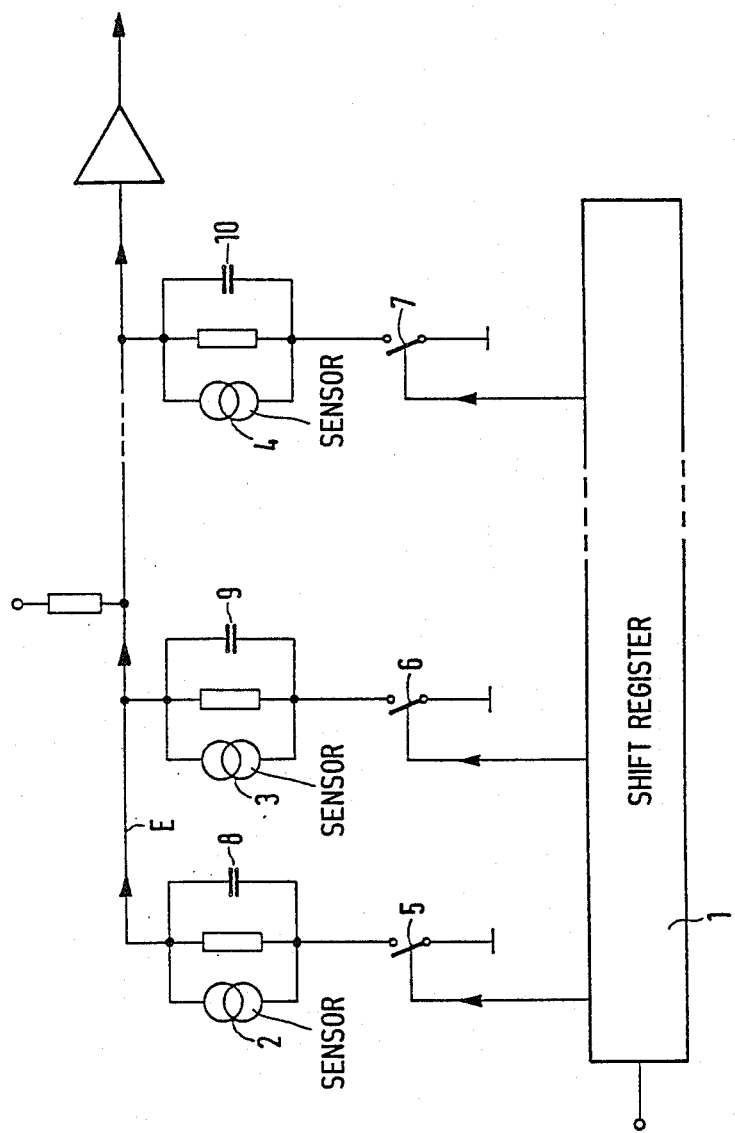
FIG. 1 is a schematic circuit diagram showing sensor read-out according to the known Vidicon principal.
Figure 2:
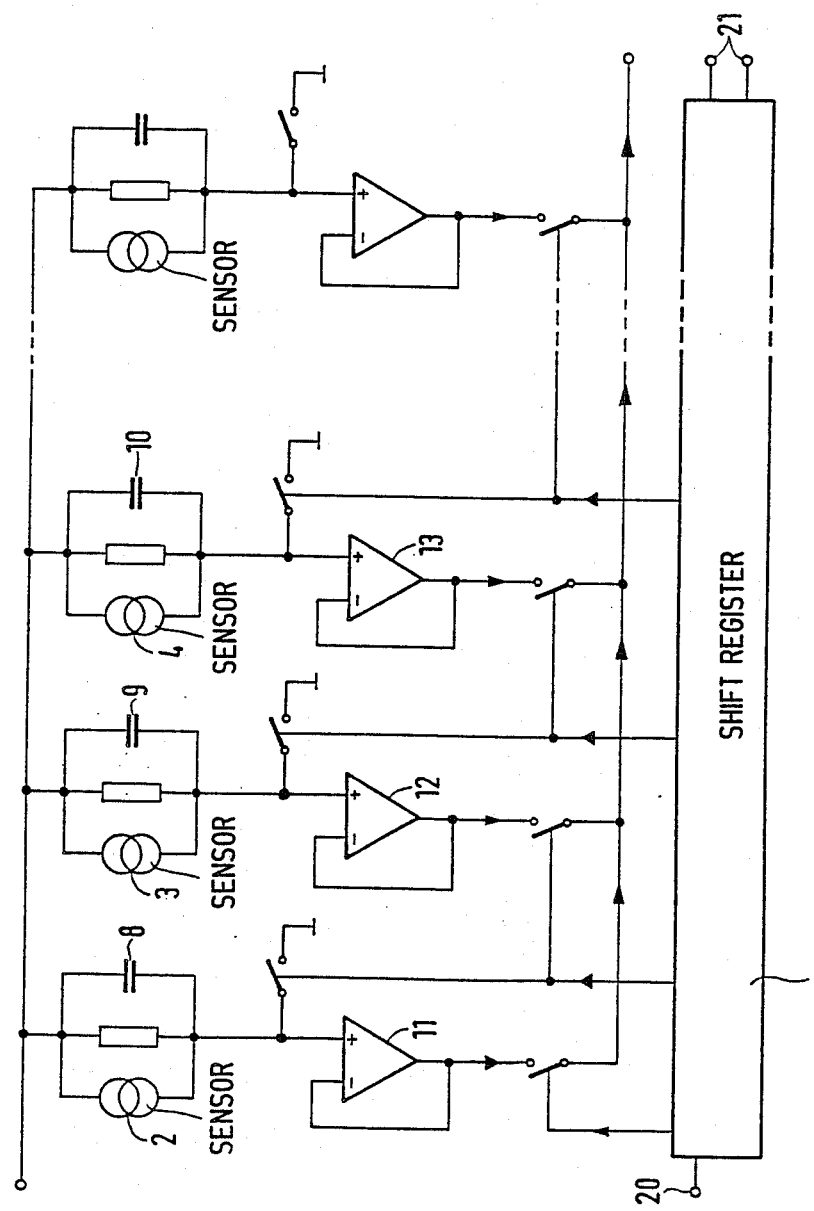
FIG. 2 is a schematic circuit diagram showing sensor read-out according to the known principal of voltage measurement at the sensors.
Figure 3:
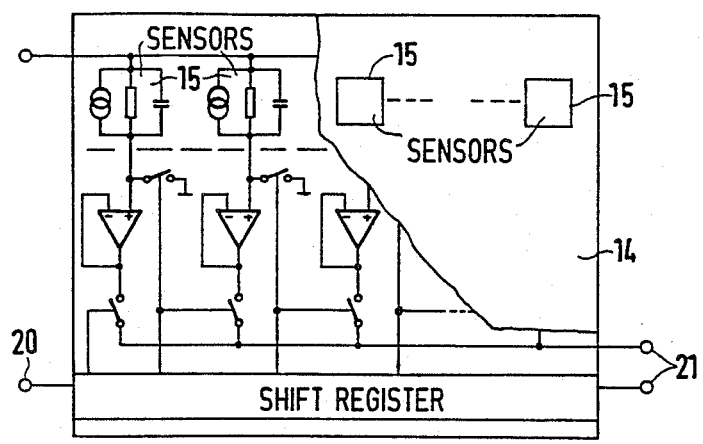
FIG. 3 is a sensor module, partly broken away, constructed in accordance with the principals of the present invention.

A sensor module 14 constructed in accordance with the principals of the present invention is shown in FIG. 3. The module 14 includes a series of optical sensors 15, for example, photodiodes, phototransistors, or photocapacitors, forming a module sensor line, and a processing circuit for each sensor combined as an integrated circuit. The original to be scanned therefor and converted is moved perpendicular to the row or line of sensors 15 relative to the module 14.

An image sensor line of arbitrary length can be constructed by successively joining the module sensor lines of the modules 14 of the type shown in FIG. 3. Each module 14 may, for example, contain 128 sensors 15 corresponding to 128 picture elements. The image sensor line of arbitrary length can be matched to the format to be read for an imaging scale of 1:1.

Figure 4:
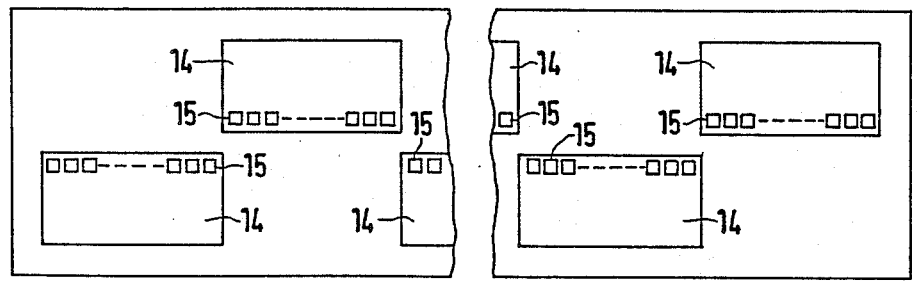
FIG. 4 is a plan view showing a sensor line consisting of a plurality of modules of the type shown in FIG. 3.

Irregularities in the picture element arrangement may occur as a result of the successive joining of the modules 14, due to difficulty in precisely positioning the modules at the module-to-module boundary. These difficulties are overcome by the embodiment shown in FIG. 4, wherein a plurality of modules 14 are disposed in sets along parallel lines offset relative to each other so that two rows having a spacing of, for example, 330 μm result. The signals which are read out are intermediately stored and ordered.

Figure 5:
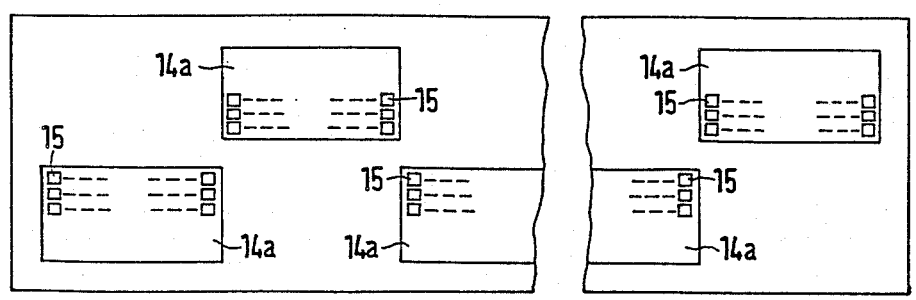
FIG. 5 is a plan view of a further embodiment of a sensor line constructed from a plurality of modules in accordance with the principals of the present invention, each module having more than one module sensor line.

Instead of only one sensor row per module 14, another module embodiment 14a as shown in FIG. 5 may have a plurality, such as three, sensor rows. The spacing of the sensor rows is based exclusively on the conditions of the optical imaging system. By using line-by-line color imaging or filtering, the embodiment of FIG. 5 permits reading and processing of an original in color. The arrangement need not necessarily include three lines per module 14a; other numbers of lines and color codings differing from line-shaped color codings are possible. The important result is that color processing with a higher picture element resolution is possible in the embodiment of FIG. 5 in contrast to the use of only one sensor line. Moreover, a lengthening of the read out time in comparison to black and white read out is not required due to the parallel evauation of the color separations.

The embodiment of FIG. 5 may also be used for accelerated black and white read out of an original without color coding, so that the read out time per line is shortened by a factor corresponding to the number of additional sensor lines, given the same integration time per line. For this application, however, a discontinuous line advance is necessary.

Although modifications and changes may be suggested by those skilled in the art, it is the intention of the inventors to embody within the patent warranted hereon all changes and modifications as reasonably and properly come within the scope of their contribution to the art.

We claim as our invention:

1. A contact image sensor line for reading and processing optical information comprising:
   a plurality of discrete integrated circuit modules, each module having a plurality of parallel sensor lines each consisting of a plurality of integrated optoelectrical sensors, and a plurality of processing circuits respectively connected to said sensors as part of said integrated circuit in said module, said modules being disposed successively along said contact image sensor line with said module sensor lines in combination forming said contact image sensor line.

2. An image sensor line as claimed in claim 1, wherein said modules are disposed adjacent to each other along a single line.

3. An image sensor line as claimed in claim 1, wherein said modules are alternatingly disposed along two parallel lines.

* * * * *